(12) United States Patent
Chiu et al.

(10) Patent No.: US 10,720,916 B2
(45) Date of Patent: *Jul. 21, 2020

(54) CONTROL CIRCUIT AND METHOD THEREFOR

(71) Applicant: SEMICONDUCTOR COMPONENTS INDUSTRIES, LLC, Phoenix, AZ (US)

(72) Inventors: Chen-Hua Chiu, New Taipei (TW); Guang-Chao Zhang, San Jose, CA (US); Mao-Sheng Lin, New Taipei (TW); HyeongSeok Baek, Gimpo (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/276,759

(22) Filed: Feb. 15, 2019

(65) Prior Publication Data
US 2019/0181855 A1 Jun. 13, 2019

Related U.S. Application Data

(63) Continuation of application No. 15/730,967, filed on Oct. 12, 2017, now Pat. No. 10,250,252.
(Continued)

(51) Int. Cl.
*H03K 17/16* (2006.01)
*H02M 3/156* (2006.01)
(Continued)

(52) U.S. Cl.
CPC ............ *H03K 17/166* (2013.01); *H02M 1/36* (2013.01); *H02M 3/156* (2013.01);
(Continued)

(58) Field of Classification Search
CPC .... H03K 17/166; H03K 17/063; H03K 17/60; H03K 19/017518; H03K 17/082;
(Continued)

(56) References Cited

U.S. PATENT DOCUMENTS 6,229,366 B1 5/2001 Balakirshnan et al.
6,414,627 B1 7/2002 McEwan
(Continued)

OTHER PUBLICATIONS

Received STIC search report from EIC 2800 searcher Mesfin Getaneh on Jun. 28, 2019. (Year: 2019).*
(Continued)

*Primary Examiner* — Emily P Pham
*Assistant Examiner* — Htet Z Kyaw
(74) *Attorney, Agent, or Firm* — Robert F. Hightower (57) ABSTRACT

In one embodiment, a control circuit may be configured to form a switching signal to switch a power transistor at a frequency to regulate an output voltage of the power supply to a target value wherein the control circuit is configured to operate in a normal operating mode and a start-up mode and wherein the control circuit is configured to switch the switching signal at a target frequency in response to operating in the normal operating mode. A first circuit may be configured to control the frequency of the switching signal to increase from a first frequency to a second frequency that is less than the target frequency in response to operating in the start-up mode.

20 Claims, 8 Drawing Sheets

US 10,720,916 B2
Page 2

Related U.S. Application Data (60) Provisional application No. 62/416,920, filed on Nov. 3, 2016.

(51) Int. Cl.
  *H02M 1/36* (2007.01)
  *H03K 17/082* (2006.01)
  *H03K 19/0175* (2006.01)
  *H03K 17/60* (2006.01)
  *H02M 3/335* (2006.01)
  *H03K 17/06* (2006.01)
  *H02M 1/00* (2006.01)

(52) U.S. Cl.
  CPC ..... *H02M 3/1563* (2013.01); *H02M 3/33507* (2013.01); *H03K 17/063* (2013.01); *H03K 17/082* (2013.01); *H03K 17/60* (2013.01); *H03K 19/017518* (2013.01); *H02M 2001/0032* (2013.01); *H03K 2217/0081* (2013.01)

(58) Field of Classification Search
  CPC ...... H03K 2217/0081; H02M 3/33507; H02M 3/1563; H02M 1/36; H02M 3/156; H02M 2001/0032
  USPC .......................................................... 323/282
  See application file for complete search history.

(56) References Cited

U.S. PATENT DOCUMENTS

| | | | |
|---|---|---|---|
| 6,828,766 B2 | 12/2004 | Corva et al. | |
| 7,236,028 B1 | 6/2007 | Choi | |
| 7,586,297 B2 | 9/2009 | Kitagawa | |
| 7,973,520 B2 * | 7/2011 | Kondo | H01L 41/044 323/247 |
| 8,045,348 B2 | 10/2011 | Zhu et al. | |
| 8,169,802 B2 | 5/2012 | Kim et al. | |
| 8,213,823 B2 * | 7/2012 | Yamamoto | H02M 1/36 310/318 |
| 8,804,380 B2 * | 8/2014 | Gao | H02M 3/335 363/21.16 |
| 8,823,353 B2 * | 9/2014 | Zhang | H02M 3/33507 323/283 |
| 9,685,875 B2 | 6/2017 | Nishijima | |
| 2004/0041762 A1 | 3/2004 | Naiki et al. | |
| 2009/0033393 A1 * | 2/2009 | Park | H02M 3/33507 327/175 |
| 2011/0142478 A1 * | 6/2011 | Takayama | H01L 41/044 399/88 |
| 2014/0217999 A1 | 8/2014 | Wibben et al. | |
| 2014/0328090 A1 | 11/2014 | Takahashi et al. | |
| 2015/0222176 A1 | 8/2015 | Asinovski et al. | |
| 2015/0244276 A1 | 8/2015 | Li | |
| 2017/0005583 A1 | 1/2017 | Choi | |
| 2017/0194876 A1 * | 7/2017 | Minobe | G03G 15/80 |
| 2017/0373602 A1 | 12/2017 | Lian | |
| 2018/0048320 A1 | 2/2018 | Zanetta | |
| 2019/0379275 A1 * | 12/2019 | Hirabayashi | G03G 15/80 |

OTHER PUBLICATIONS

Received STIC search report from EIC 2800 searcher Samir Patel for claim 1 on Jun. 21, 2019. (Year: 2019).*

* cited by examiner

ND METHOD
CONTROL CIRCUIT AND METHOD THEREFOR

PRIORITY CLAIM TO PRIOR FILING

The present application is a continuation application of prior U.S. application Ser. No. 15/730,967 filed on Oct. 12, 2017, which claims priority to prior filed Provisional Application No. 62/416,920 entitled "STEPWISE SOFT-START CIRCUIT WITH GRADUAL FREQUENCY SETTLEMENT FOR POWER CONVERTERS" filed on Nov. 3, 2016, and having common inventors Chiu et al., all of which are hereby incorporated herein by reference and priority thereto for common subject matter is hereby claimed.

BACKGROUND OF THE INVENTION

The present invention relates, in general, to electronics, and more particularly, to semiconductors, structures thereof, and methods of forming semiconductor devices.

In the past, the electronics industry utilized various methods and structures to form power converters for use with various electronic devices such as home appliances, computers, battery chargers etc. The power converters were used to provide regulated power for electronic devices. However, many conventional power converters had an initial ringing and/or spike phenomenon in the inductor current such as for example when starting up from an initial power on sequence and especially when the output voltage was low. The initial ringing and/or spiking could adversely affect the regulation of the power converters.

Accordingly, it is desirable to provide a power converter that reduces the initial ringing and/or spiking or that improves the regulation.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten per cent (10%) (and up to twenty per cent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures, or characteristics may be combined in any suitable manner, as would be apparent to one of ordinary skill in the art, in one or more embodiments.

The embodiments illustrated and described hereinafter suitably may have embodiments and/or may be practiced in the absence of any element which is not specifically disclosed herein.

DETAILED DESCRIPTION

Figure 1:
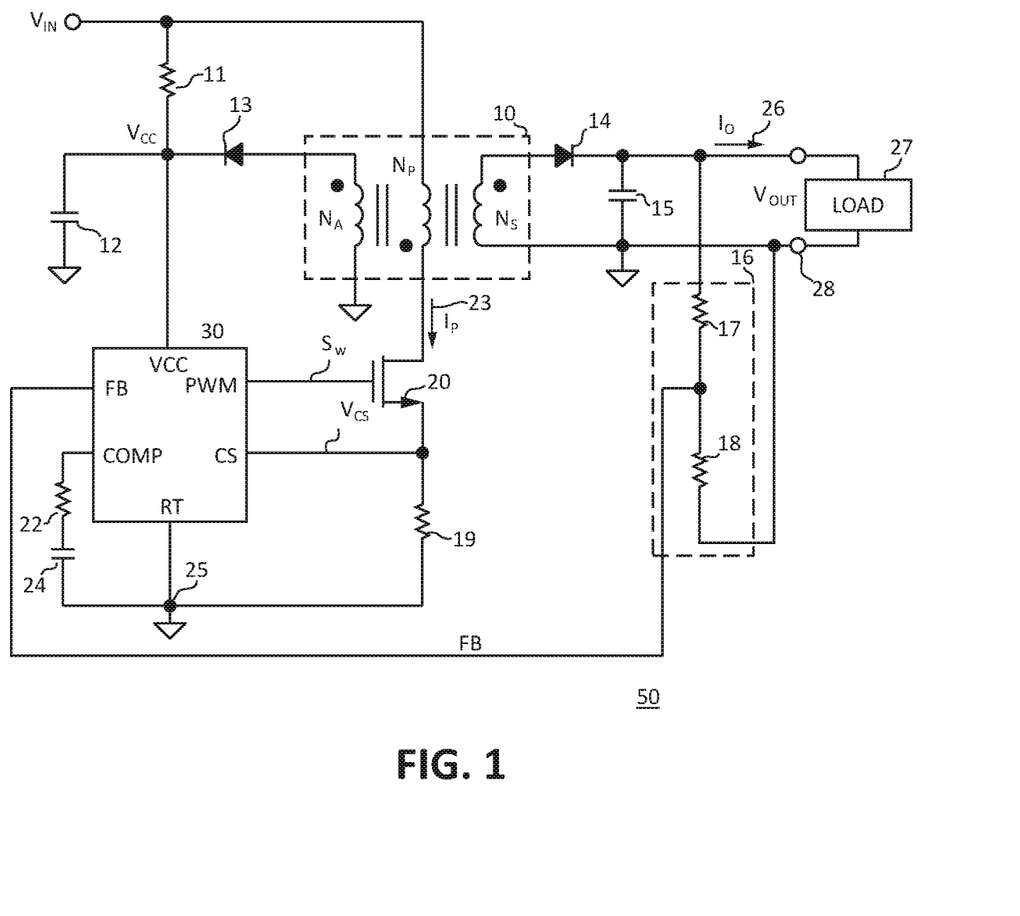
FIG. 1 schematically illustrates an example of a portion of an embodiment of a flyback power supply system in accordance with the present invention.

FIG. 1 schematically illustrates an example of a portion of an embodiment of a flyback power supply system 50. System 50 includes a transformer 10 that has a primary winding Np, a secondary winding Ns, and may optionally include an auxiliary winding Na. The primary winding Np is connected to receive an input voltage $V_{IN}$ from an input terminal of system 50. Input voltage $V_{IN}$ may be a rectified DC voltage that is formed from rectifying an AC voltage or alternately may be a DC voltage. The primary side of system 50 has a common return 25. System 50 also includes a power switch, such as for example a power transistor 20, that is connected to primary winding Np to form a primary current 23 (Ip) that flows through primary winding Np. Transistor 20 is configured to be coupled to a second terminal of primary winding $N_P$ to switch transformer 10 for transferring energy from primary winding $N_P$ to secondary winding $N_S$ and to auxiliary winding $N_A$. A current sense element 19 may be connected to transistor 20 to form a current sense CS signal that is representative of primary current 23 (Ip). In an embodiment, current-sense element 19 may be coupled in series between transistor 20 and common return 25 for generating the current-sense (CS) signal in response to primary current 23 ($I_P$). In an embodiment, current sense element 19 may be a resistor, but may be other well-known current sense elements in other embodiments, such as for example a Sense-FET circuit.

A rectifier 14 (illustrated in general by a diode) and a capacitor 15 are connected to secondary winding Ns to facilitate forming an output voltage $V_O$ and an output current 26 ($I_O$). A load 27 maybe connected to the outputs of system 50 to receive output voltage $V_O$ and output current 26. A feedback circuit 16 may be connected to receive output voltage $V_O$ and form a feedback (FB) signal that is representative of the value of output voltage $V_O$. An embodiment may include that FB circuit 16 may be configured as a resistor divider that includes resistors 17 and 18 coupled between an output terminal and an output return 28 of secondary winding Ns. For example, the voltage divider may include that resistor 17 is coupled to resistor 18 in series, and the series combination may be coupled between the output voltage $V_O$ and output return 28. However, feedback circuit 16 may have various other embodiments including an optical coupler or other FB circuits that are well-known to those skilled in the art. Although output return 28 is illustrated as the same as common return 25, in some embodiments output return 28 may be a different return voltage than common return 25.

System 50 includes a control circuit 30 that is configured to reduce ringing and spikes in primary current 23 ($I_P$). Control circuit 30 is configured to generate a switching signal $S_W$ at an output terminal PWM to switch transformer 10 via the power switch, such as for example transistor 20. An embodiment of control circuit 30 controls switching signal $S_W$ in accordance with the FB signal and/or the CS signal for regulating the output (output voltage $V_O$ and/or output current 26), for example regulating output voltage $V_O$ to a target value. In an embodiment, output voltage $V_O$ may be regulated to the target value or target range that is within a range of values around a desired value. For example, the desired value may be five volts (5v) and the target value or target range may be plus or minus five percent (5%) around the five volts.

An embodiment of control circuit 30 may include a supply terminal VCC, output terminal PWM, a current sense terminal CS, a feedback terminal FB, a compensation terminal COMP, and a common return terminal RT. Terminal RT is configured to be connected to a common return voltage such as for example a common ground or other common voltage. In an embodiment, return terminal RT may be connected to return 25. Compensation elements are connected to compensation terminal COMP to provide frequency compensation for amplifiers within circuit 30. In an embodiment, the compensation elements may include a compensation resistor 22 and a compensation capacitor 24. Resistor 22 and capacitor 24 may be coupled together in series and also may be connected in series between compensation terminal COMP and common return 25.

A resistor 11 may be coupled between input voltage $V_{IN}$ and a capacitor 12 to receive the input voltage $V_{IN}$ and form a supply voltage Vcc for circuit 30. An embodiment may include that resistor 11 and capacitor 12 may be coupled to the supply terminal VCC of circuit 30 to provide the supply voltage to circuit 30. Input voltage $V_{IN}$ charges capacitor 12 through resistor 11 for forming supply voltage $V_{CC}$. Auxiliary winding $N_A$ may be coupled to a diode 13 to also assist in forming supply voltage Vcc. The auxiliary winding $N_A$ may be coupled to capacitor 12 and to the supply terminal VCC of the control circuit 30 through diode 13. In response to switching primary winding $N_P$, auxiliary winding $N_A$ charges capacitor 12 through diode 13 for forming the supply voltage $V_{CC}$. Resistor 11 may assist in forming Vcc during start-up before circuit 30 has switched transistor 20 a sufficient number of times to cause output voltage $V_O$ to reach the target value. In response to output voltage $V_O$ reaching substantially the target value, supply voltage Vcc may reach the desired operating voltage for circuit 30. Although transistor 20 is illustrated as external to circuit 30, in some embodiments transistor 20 may be a part of circuit 30. The feedback (FB) signal is coupled to the feedback terminal FB of control circuit 30 to achieve feedback regulation. Current-sense element 19 is further coupled to supply the CS signal to the CS terminal of control circuit 30. Thus, control circuit 30 receives the current-sense (CS) signal for generating the switching signal $S_W$ or alternately for regulating primary current 23.

An embodiment of circuit 30 may include a leading edge blanking (LEB) circuit 39. Circuit 39 may be configured to receive the CS signal from the CS input and ignore or blank portions at the leading edge of changes in the CS signal. Thus, circuit 39 may not pass the initial portion of changes in the received CS signal to the output of circuit 39. Circuit 39 is configured to form another current sense (CS) signal that is also representative of primary current 23 but the leading edge is blanked to eliminate noise spikes in the CS signal. Therefore, the signal from circuit 39 is also referred to as the current sense (CS) signal that is representative of current 23. Such LEB circuits are well known to those skilled in the art.

As will be seen further hereinafter, circuit 31 may be configured to have several different operating modes or sequences that include a normal operating mode, a start-up operating sequence or start-up sequence, and a non-switching mode. The normal operating mode is a mode in which circuit 30 is switching transistor 20 with switching signal $S_W$, and regulating output voltage $V_O$ to the target value, thus, output voltage $V_O$ is maintained to the target value, thus, within the range of the target value. Those skilled in the art will appreciate that the normal operating mode may also include a burst mode operation or skip-cycle operation wherein switching signal $S_W$ may not be switched for a number of cycles of the switching frequency in order to maintain output voltage $V_O$ within the target value. The skip-cycle operation is part of the normal operating mode because it maintains output voltage $V_O$ within the range of the target value.

The non-switching mode is a mode in which circuit 30 is not switching the switching signal $S_W$ and output voltage $V_O$ is not within the range of the target value. The non-switching mode may be a result a variety of conditions such as power not being applied to circuit 30, or a fault condition that may occur even though operating power is applied to circuit 30. For example, when power is first applied to system 50 (FIG. 1), thus to circuit 30, circuit 30 has not been switching signal $S_W$ due to the lack of operating power which results in a non-switching mode. In another example, the operating power for circuit 30 may be removed while circuit 30 is operating. Thus, circuit 30 may be configured to detect that the operating power has decreased to less than a lower threshold value and to stop switching of the SW signal which results in a non-switching mode. The non-switching mode may last until the operating power returns to greater than the threshold value. In an embodiment, a portion of circuit 30 (not shown) may detect a fault condition. The fault condition may result from various conditions, such as for example an overvoltage condition of output voltage $V_O$, for example output voltage $V_O$ having a value much greater than the high range of the target value, such as approaching a value that may damage some circuitry. Circuit 30 may be configured to detect such a fault condition and thus may terminate switching of switching signal $S_W$ resulting in a non-switching mode. The fault condition may also result from an over current condition of output current $I_O$, or other well-known fault condition. Portions of circuit 30 may be configured to stop the switching of signal $S_W$ in response to the fault condition, thus, causing a non-switching mode. In an embodiment, the non-switching mode may last for a short or a long time interval. For example a short time interval of five to ten (5-10) milliseconds, or a long time interval of more than ten and up to a hundred or more (10-100 or greater) milliseconds. An optional embodiment of circuit 30 may be configured to detect that signal SW has not been switched for a time interval, such as for example the short or long time interval, and to cause circuit 30 to operating in the non-switching mode.

As used herein, start-up sequence is intended to mean any operation that initiates switching of signal $S_W$ after signal $S_W$ was not switched. For example, initiate switching of signal $S_W$ after signal $S_W$ was not switched during the non-switching mode. In another example, after power is applied (or re-applied) or the fault condition is terminated, circuit 30 may be configured to initiate switching of signal $S_W$ according to the start-up sequence, for example after operating in the non-switching mode. Circuit 30 may be configured to terminate the non-switching mode and initiate switching of switching signal $S_W$ according to the start-up sequence, thus, initiate a start-up sequence.

Figure 2A:
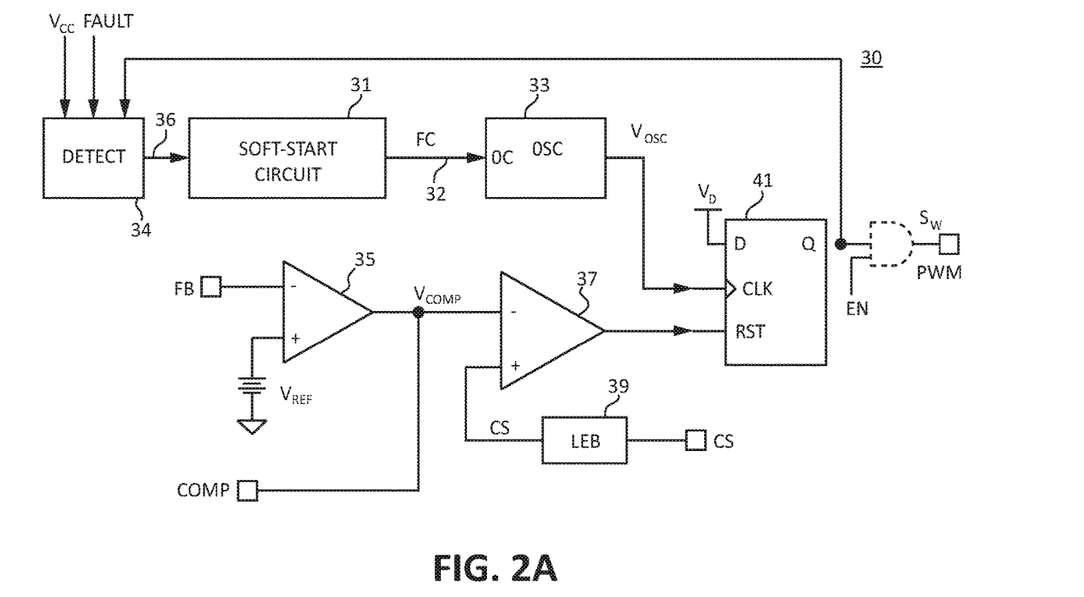
FIG. 2A schematically illustrates an example of a portion of an embodiment of a circuit of the system of FIG. 1 in accordance with the present invention.

FIG. 2A schematically illustrates an example of a portion of an embodiment of circuit 30. Control circuit 30 includes a soft-start signal generation circuit or soft-start circuit 31, a variable frequency oscillator (OSC) 33, an error amplifier 35, a comparator 37, and a D-type flip-flop 41. Circuit 30 may also include an optional detect circuit 34 that may be configured to receive a protection signal from a circuit (not shown) that detects a fault condition, such as for example one of the previously explained fault conditions. Circuit 34 may also detect power being applied to circuit 30 such as after power was removed. Optionally, circuit 34 may also be configured to detect a state of circuit 30 not switching signal $S_W$ for a time interval. Circuit 34 may have an embodiment that may form a control signal that may be used to stop the switching of the $S_W$ signal, thus cause a non-switching mode. In an embodiment, circuit 34 may form a signal 36 that is asserted in response to detecting one or more of the fault conditions. Circuit 31 may receive signal 36 from circuit 34. In an embodiment, signal 36 may be an optional enable (EN) that may be used by circuit 31.

Soft-start circuit 31 is configured to form a soft-start frequency control (FC) signal 32 that is received on an oscillator control (OC) input of oscillator 33. Oscillator 33 may be configured to form an oscillation signal $V_{OSC}$ in response to FC signal 32. Oscillation signal $V_{OSC}$ is coupled to a clock terminal CLK of flip-flop 41 for generating the switching signal $S_W$. Those skilled in the art will appreciate that in some embodiments, there may be other circuitry between the output of flip-flop 41 and the $S_W$ signal that is provided to the PWM terminal. For example, there may be a driver buffer or some logic circuit to form certain edges or, for some application a dead time between certain edges of the $S_W$ signal. An embodiment may include an optional AND gate, illustrated in dashed lines, between the Q output of flip-flop 41 and the $S_W$ signal. In such an embodiment, circuit 34 may or may not receive the $S_W$ signal. The optional AND gate may receive the EN signal and block the switching of flip-flop 41 from affecting the $S_W$ signal. An input terminal D of flip-flop 41 is coupled to a supply voltage $V_d$ in order to generate switching signal $S_W$ at an output terminal Q of flip-flop 41. The frequency of oscillation signal $V_{OSC}$ is controlled by the level of the signal received on the OC input terminal of oscillator 33, for example FC signal 32. Thus, the frequency of the switching signal $S_W$ is determined by the frequency of the oscillation signal $V_{OSC}$. For example, during the start-up sequence, FC signal 32 can control the switching frequency of switching signal S.

Figure 2B:
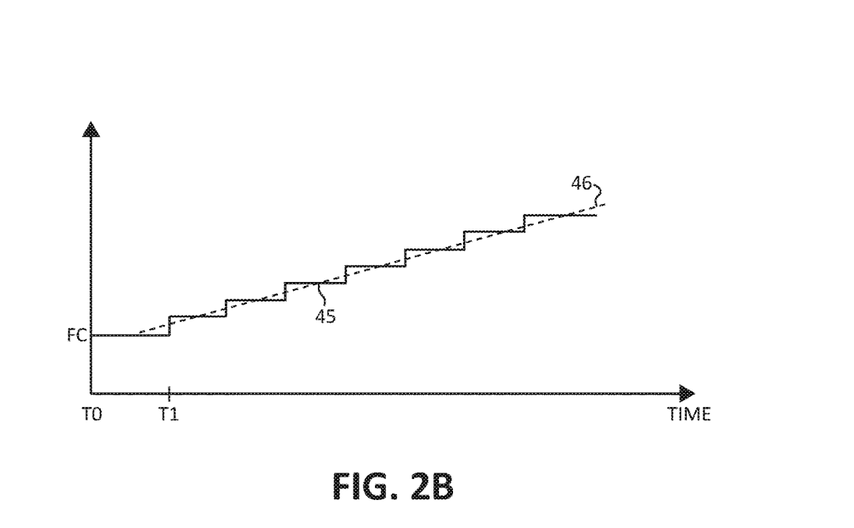
FIG. 2B is a graph having a plot that illustrates an example of an embodiment of a signal of the circuit of FIG. 2A in accordance with the present invention.

FIG. 2B is a graph having a plot 45 that illustrates an example of an embodiment of FC signal 32. The abscissa indicates time and the ordinate indicates increasing value of the illustrated signal. This description has references to FIG. 2A and FIG. 2B.

During the start-up sequence, control circuit 30 is configured to gradually increase the switching frequency of the switching signal S. In an embodiment, circuit 30 may be configured to increase the frequency of switching signal $S_W$ from approximately zero hertz to a frequency at which output voltage $V_O$ achieves the target value, such as is within the range of the target value. For example, if the switching of the switching signal $S_W$ is terminated, the frequency is substantially zero. An embodiment of circuit 30 may be configured to initiate a start-up sequence and start switching signal $S_W$ at some minimum frequency, such as for example a frequency no less than approximately twenty (20) KHz, thus the frequency would step from substantially zero to approximately the minimum frequency, then increase in response to the value of the signal received on the OC input of circuit 33. Alternately, circuit 30 may be configured to slowly increase the frequency of switching signal $S_W$ from approximately the minimum frequency to a frequency that is greater than the minimum frequency independently of output voltage $V_O$. An embodiment of circuit 30 may be configured to slowly increase the frequency of switching signal $S_W$ in a number of discrete increments. It has been found that gradually increasing the switching frequency during the start-up sequence reduces the amount of ringing and spikes formed in primary current 23 ($I_P$) during the start-up sequence. In an embodiment, the frequency may be increased during the start-up sequence. In an example embodiment, the switching frequency may be increased from the minimum frequency to the target frequency over an interval of approximately ten micro-seconds (10 μsec.) to an interval of approximately eight hundred micro-second (800 μsec.). In other embodiments, the frequency may be increased at other rates.

In an embodiment, an asserted state of the Vosc signal clocks flip-flop 41 to assert signal S. Thus, to initiate the on-time of transistor 20. The off-time of transistor 20 is initiated by an off-time control circuit of circuit 30. The period or cycle of signal $S_W$ is the same as the period of the $V_{OSC}$ signal and is the sum of the on-time and the off-time, plus some optional dead-time between the switching of the signals. The off-time control circuit may include error amplifier 35 and comparator 37. Circuit 30 may be configured to receive the FB signal from the FB terminal. The FB signal may be coupled to a negative input terminal of error amplifier 35. A reference signal $V_{ref}$ may be coupled to a positive input terminal of error amplifier 35. Error amplifier 35 may be configured to form an error signal in response to the FB signal and the reference signal. The output of error amplifier 35 may also be connected to the COMP terminal to provide frequency compensation for amplifier 35. The components connected to the COMP terminal form the error signal into a control signal $V_{COMP}$. Control signal $V_{COMP}$ is connected to the negative input of comparator 37, and the current-sense signal CS from LEB circuit 39 is coupled to the positive input of comparator 37. Comparator 37 generates a reset signal by comparing the control signal $V_{COMP}$ and current-sense signal CS. The reset signal is coupled to the reset input RST of flip-flop 41 for initiating the off-time of signal S. Thus, the reset signal disables the switching signal $S_W$ to start the off-time of transistor 20.

Referring to FIG. 2B, assume that prior to a time T0, circuit 30 has terminated switching of signal $S_W$ during a non-switching mode, thus terminated switching transistor 20. Thus, the level of FC signal 32 is low, such as for example at a minimum value. In an embodiment, the minimum value may be approximately zero to stop the operating of circuit 33. In other embodiments, the minimum value of FC signal 32 may not be zero but may be at some minimum value that is greater than zero. In such an embodiment, circuit 33 may still be forming the $V_{OSC}$ signal but the $V_{OSC}$ signal from circuit 33 may be blocked from affecting switching signal S. At time T0, circuit 30 initiates the start-up sequence and begins to initiate switching of signal $S_W$ at a frequency that is controlled by the value of FC signal 32. During the start-up sequence, soft-start circuit 31 is configured to gradually increase the value of FC signal 32 which gradually increases the frequency of signal $V_{OSC}$, thus, the frequency of signal $S_W$. Therefore, circuit 30 is configured to increase the frequency of switching signal $S_W$ from a first value to a second value that is greater than the first value during the start-up sequence. Gradually increasing the frequency of switching signal $S_W$ reduces ringing and also reduces spikes in output current $I_O$.

In an embodiment, circuit 30 may be configured to increase the frequency of signal $S_W$ in a number of discrete (or digital) steps as illustrated by plot 45, or alternately may increase the frequency linearly as illustrated by dashed plot 46. For example, circuit 30 may be configured to increase signal FC in eight steps or alternately increase it in any number of steps such as for example twelve or sixteen. In an embodiment, soft-start circuit 31 and oscillator 33 may be configured to operate as a stepwise soft-start control circuit.

Figure 3A:
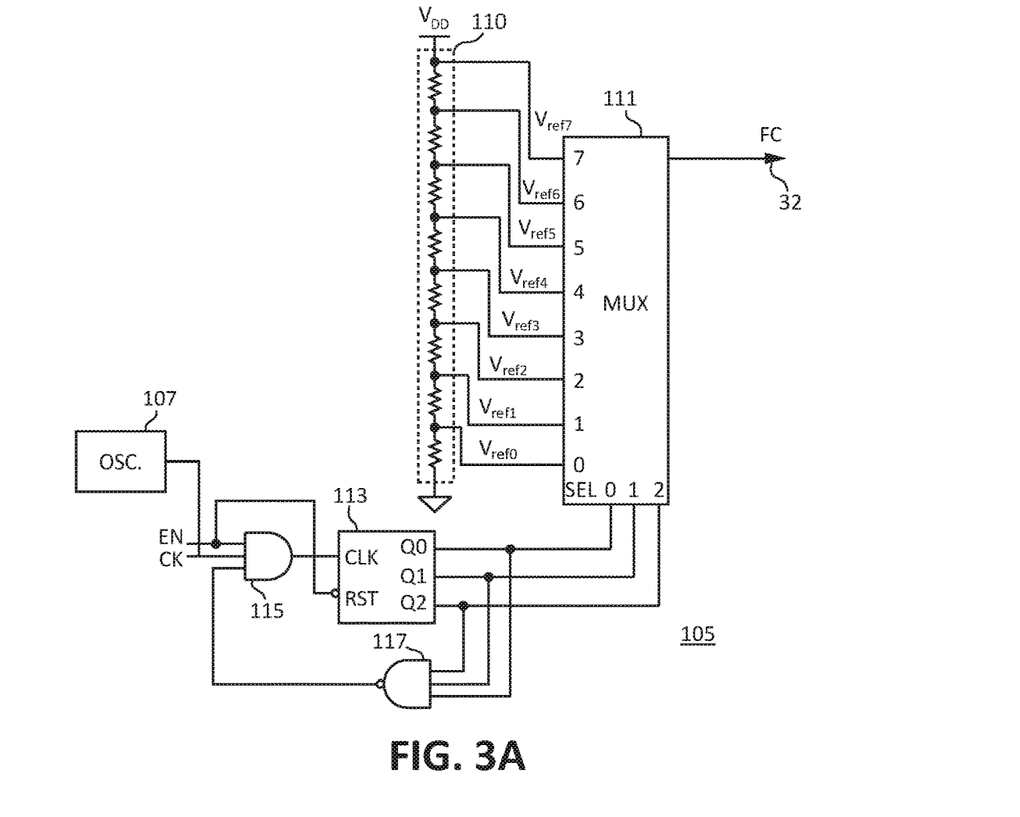
FIG. 3A schematically illustrates an example of a portion of an embodiment of a circuit that may be an alternate embodiment of one of the circuits of FIG. 2A in accordance with the present invention.

FIG. 3A schematically illustrates an example of a portion of an embodiment of a soft-start circuit 105 that may have an embodiment that may be an alternate embodiment of circuit 31. Soft-start circuit 105 is configured to form FC signal 32 to have a value that increases in eight discrete or digital increments. Circuit 105 includes a multiplexer 111, a counter 113, a NAND gate 117, and an AND gate 115. Circuit 105 may also have an embodiment that optionally may include a timing circuit that may be configured to form a clock (CK) signal that may be used to clock counter 113. An example embodiment of the timing circuit may be an oscillator 107. In an embodiment, oscillator 107 may operate a lower frequency than any of the frequencies of signal $S_W$. The CK signal may have a frequency that is ten (10) or more times less than any of the frequencies of signal $S_W$. For example, an embodiment of oscillator 107 may be a counter that is clocked by the $V_{OSC}$ signal. In another embodiment oscillator 107 may be a separate oscillator from oscillator 33. For example, oscillator 107 may operate at a fixed frequency. An embodiment of soft-start circuit 105 may include a voltage divider 110 that is configured to form a plurality of reference voltages $V_{ref0} \sim V_{ref7}$. Each individual reference voltage may be coupled to a respective input terminal of a multiplexer 111 for forming the discrete values of FC signal 32. Multiplexer 111 has three selection input terminals SEL0, SEL1, and SEL2 that select one of the input terminals to the output. The selection input terminals SEL0, SEL1, and SEL2 are coupled to a respective output terminal (Q0, Q1 and Q2) of counter 113 for selecting one of the reference voltages $V_{ref0}$~$V_{ref7}$ as the FC signal 32.

Figure 3B:
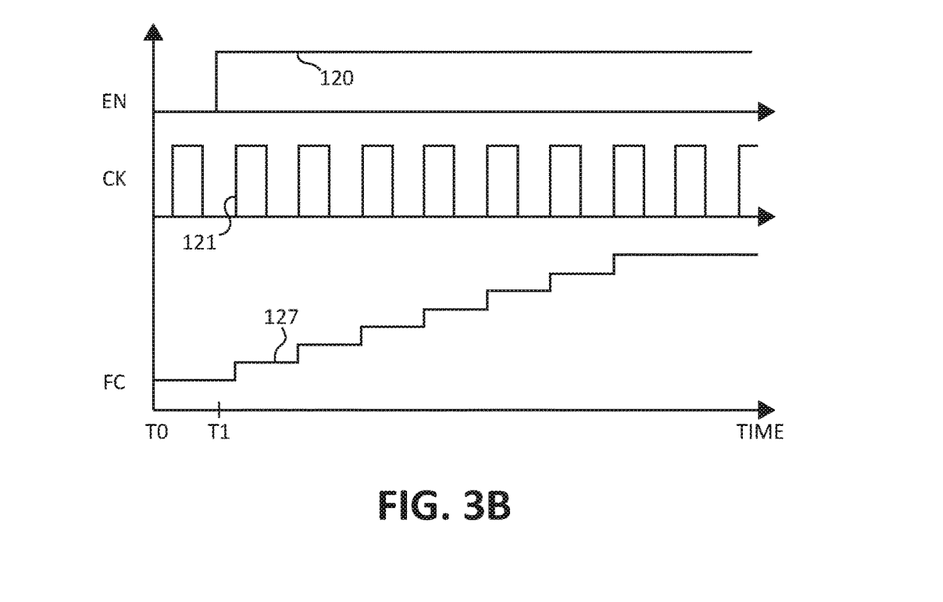
FIG. 3B is a graph having plots that illustrate some of the signals formed during an example of an operation of the circuit of FIG. 3A in accordance with the present invention.

FIG. 3B is a graph having plots that illustrate some of the signals formed during an example of an operation of circuit 105. The abscissa indicates time and the ordinate indicates increasing values of the illustrated signal. A plot 120 illustrates the enable (EN) signal, a plot 121 illustrates the clock (CK) signal, and a plot 127 illustrates FC signal 32. This description has references to FIG. 2A, FIG. 3A, and FIG. 3B.

Assume that prior to a time T0, circuit 30 is not switching signal $S_W$ and that the EN signal is negated. For example, the EN signal may be the signal formed by circuit 34 (FIG. 2A). The negated EN signal resets counter 113 to a zero value which causes multiplexer 111 to select reference signal $V_{REF0}$ to be the level of FC signal 32. The negated EN signal maintains counter 113 reset and blocks the CK signal from affecting counter 113.

Assume that at a time T1, circuit 30 initiates switching of signal $S_W$ and initiates a start-up sequence. Circuit 30 then asserts the EN signal and counter 113 starts to count up from zero to seven in response to each pulse of the CK signal. The EN signal may be formed by circuit 34 or may be formed by another portion of circuit 30 (not shown). Multiplexer 111 may be formed to sequentially select the reference voltages $V_{ref1}$~$V_{ref7}$ as the value of FC signal 32 according to the counter value of counter 113. Accordingly, the level of FC signal 32 will be gradually increased during the start-up sequence. In response to the increasing value of FC signal 32, oscillator 33 (FIG. 2A) will correspondingly increase the frequency of the oscillation signal $V_{OSC}$. Circuit 30 will gradually increase the switching frequency of switching signal $S_W$ during the start-up sequence. Once counter 113 counts up to seven, the levels of the output signals outputted by the output terminals Q0, Q1, and Q2 of counter 113 are all asserted which negates the output signal of NAND gate 117 and consequently AND gate 115 which blocks the CK signal from counting counter 113, thus, counter 113 will stop counting. FC signal 32 remains at the maximum value during the remainder of the operation of circuit 30, until circuit 30 again stops switching signal $S_W$ during the non-switching mode. In an embodiment, circuit 30 may be configured to assert signal EN in response to stopping switching signal $S_W$ for the non-switching mode. For example, circuit 30 may be configured to assert the EN signal to initiate the non-switching mode. Thus, circuit 30 is configured to gradually increase the frequency of signal $S_W$ as the duration of the start-up sequence increases.

The output terminals Q0, Q1, and Q2 of the counter 113 are further respectively coupled to the first input terminal, the second input terminal, and the third input terminal of NAND gate 117. The output terminal of NAND gate 117 is coupled to the third input terminal of AND gate 115. The first input terminal and the second input terminal of AND gate 115 receive respectively the EN signal and the CK signal. The output terminal of AND gate 115 is coupled to the CLK of counter 113. Counter 113 counts up according to the CK signal and generates the respective output signals outputted by the output terminals Q0, Q1, and Q2 according to the value of counter 113. The EN signal is also coupled to the reset terminal RST of counter 113 for resetting its counter value. The reset terminal RST is configured to cause a reset of counter 113 in response to a negated value. Circuit 105 may be configured to form FC signal 32 change each step at a time interval that is a cycle of a frequency that can be anywhere in a range of approximately twenty KHz to approximately one hundred KHz.

Those skilled in the art will appreciate that although circuit 105 is illustrated to form FC signal 32 in a series of eight (8) steps, circuit 105 may have less or more than eight (8) steps. Additionally, circuit 105 may be implements as a circuit that forms FC signal 32 to increase in an analog manner. For example, may form FC signal 32 as a ramp signal or waveshape that changes in an analog manner.

Figure 4A:
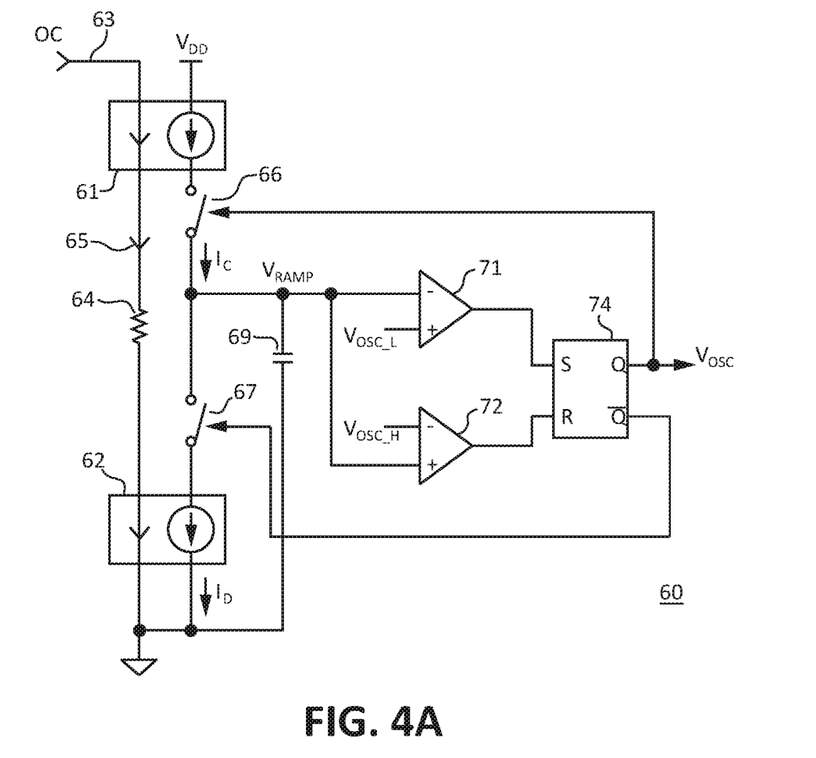
FIG. 4A schematically illustrates an example of a portion of an oscillator circuit that may have an embodiment that may be an alternate embodiment of one of the circuits of FIG. 2A in accordance with the present invention.

FIG. 4A schematically illustrates an example of a portion of an oscillator circuit or oscillator 60 that may have an embodiment that may be an alternate embodiment of oscillator 33 (FIG. 2A). Oscillator 60 may include two variable current source (CCCS) circuits or current sources 61 and 62, a resistor 64, two switches 66 and 67, a capacitor 69, two comparators 71 and 72, and an SR flip-flop 74. Oscillator 60 may have an input configured to receive an oscillator control (OC) signal 63 and form oscillator signal $V_{OSC}$. In an embodiment, such as for example the embodiment of FIG. 2A, oscillator 60 may be configured to receive FC signal 32 as oscillator control (OC) signal 63. OC signal 63 is coupled to a control input of current source 61. A resistor 64 is coupled between the control inputs of current sources 61 and 62 for generating a control current 65 to the control inputs of each of current sources 61 and 62 in response to OC signal 63. Current source 61 is further coupled to the supply voltage $V_{DD}$ to form a charge current $I_C$ whose value is controlled by control current 65. That is, the value of the charge current $I_C$ is controlled by OC signal 63. Current source 62 is further coupled to the common return RT to provide a discharge current $I_D$ whose value is also controlled by control current 65.

Switch 66 is coupled between current source 61 and a ramp capacitor 69. Switch 67 is coupled between ramp capacitor 69 and current source 62. Ramp capacitor 69 is charged by the charge current $I_C$ when switch 66 is switched on by output signal $V_{OSC}$, and capacitor 69 is discharged by the discharge current $I_D$ when switch 67 is switched on by an inverse signal outputted by the inverse output terminal Qbar of SR flip-flop 74. Therefore, a ramp signal $V_{RAMP}$ is generated across ramp capacitor 69.

Ramp signal $V_{RAMP}$ is further coupled to the negative input terminal of comparator 71. The positive input terminal of comparator 71 is coupled to receive a reference voltage $V_{OSC\_L}$ that is representative of a lower trip point voltage of $V_{RAMP}$. Comparator 71 generates an output signal coupled to a set terminal S of the SR flip-flop 74. Ramp signal $V_{RAMP}$ is also coupled to a positive input terminal of comparator 72. A negative input terminal of comparator 72 is coupled to receive a reference voltage $V_{OSC\_H}$ that is representative of an upper trip point voltage $V_{RAMP}$. Comparator 72 generates an output signal coupled to a reset terminal R of SR flip-flop 74. SR flip-flop 74 generates the output signal $V_{OSC}$ through the output terminal Q, and also generates the inverse output signal through the inverse output terminal Q bar.

Figure 4B:
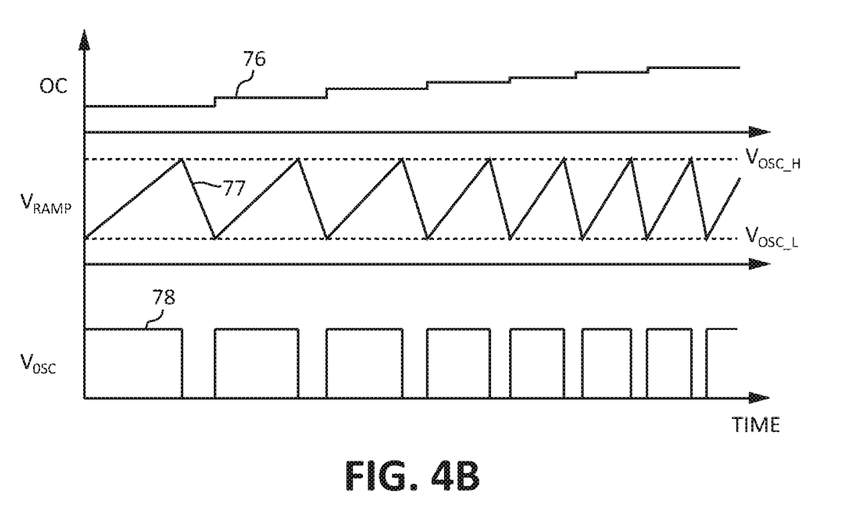
FIG. 4B is a graph having plots that illustrate some of the signals formed during an example of an embodiment of operation of the circuit of FIG. 4A in accordance with the present invention.

FIG. 4B is a graph having plots that illustrate some of the signals formed during an example of an embodiment of operation of oscillator 60. A plot 76 illustrates an example of OC signal 63, a plot 77 illustrates an example of an embodiment of the signal $V_{RAMP}$, and a plot 78 illustrates an example of an embodiment of the $V_{OSC}$ signal. During the start-up sequence, the rising slope of the ramp signal $V_{RAMP}$ is gradually increased because the level of the charge current $I_C$ is gradually increased according to the increase of the level of OC signal 63. Therefore, the frequency of the output signal $V_{OSC}$ is gradually increased during the start-up sequence.

Figure 5A:
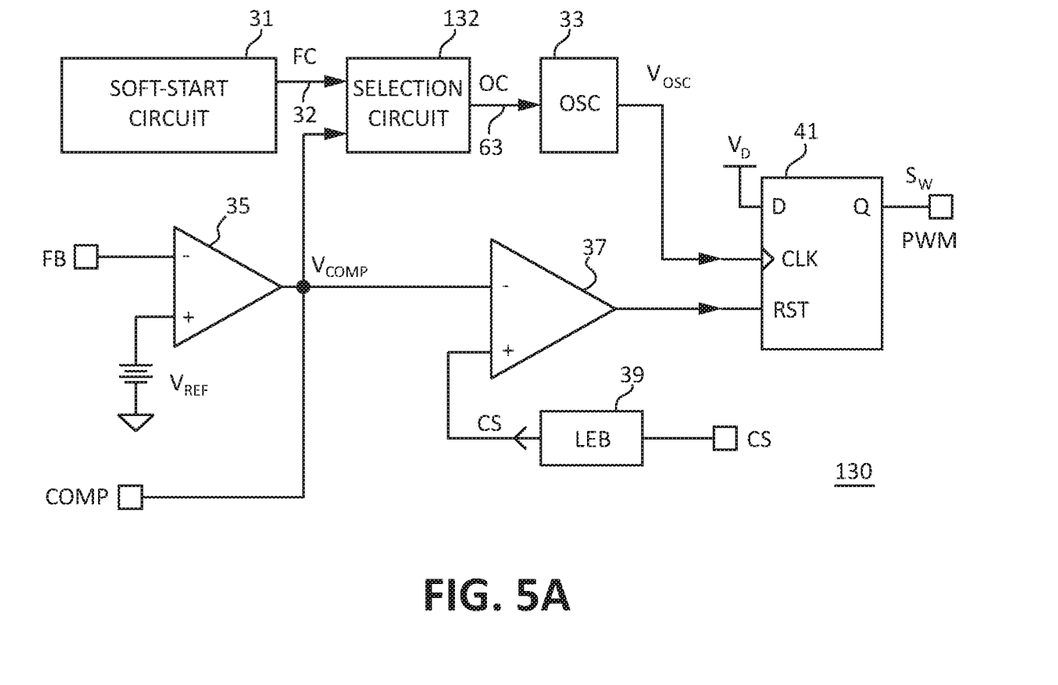
FIG. 5A schematically illustrates an example of a portion of an embodiment of a control circuit that may have an embodiment that may be an alternate embodiment of one of the circuits of FIG. 2A.

FIG. 5A schematically illustrates an example of a portion of an embodiment of a control circuit 130 that may have an embodiment that may be an alternate embodiment of circuit 30 (FIG. 2A). Circuit 130 is substantially the same as circuit 30 except that circuit 130 also includes a selection circuit 132. An embodiment of circuit 130 may be configured to terminate the start-up sequence in response to a change in load 27 (FIG. 1). Alternately, circuit 130 may be configured to terminate the start-up sequence and reduce the frequency of switching signal $S_W$ in response to a reduction in power required by load 27. Alternately, circuit 130 may be configured to terminate the start-up sequence and reduce the frequency of switching signal $S_W$ in response to output voltage $V_O$ reaching the target value.

Selection circuit 132 is configured to receive FC signal 32 formed by circuit 31 and to also receive control signal $V_{COMP}$. An embodiment of selection circuit 132 may be configured to form OC signal 63 as either FC signal 32 or control signal $V_{COMP}$. For example, an embodiment of circuit 132 may be configured to select FC signal 32 or $V_{COMP}$ as the input signal OC signal 63 to oscillator 33 according to the smallest level between FC signal 32 and control signal $V_{COMP}$. In an embodiment, selection circuit 132 may be formed to select either control signal $V_{COMP}$ or FC signal 32 as the input signal OC 63 that is received by oscillator 33 for controlling the switching frequency of the switching signal $S_W$.

Figure 5B:
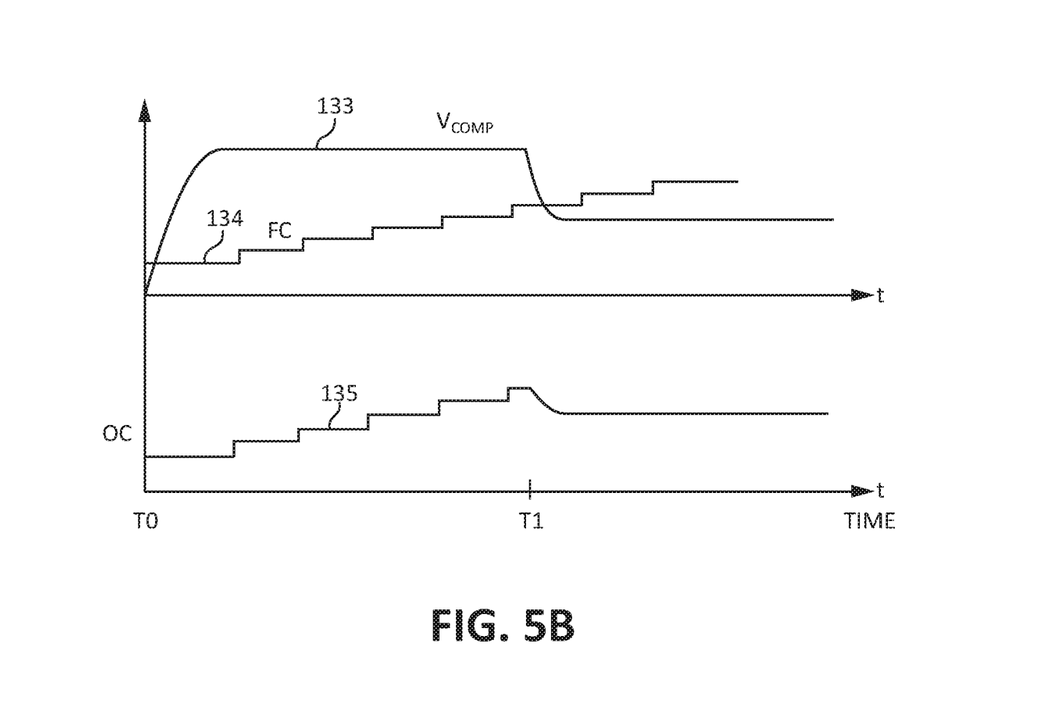
FIG. 5B is a graph having plots that illustrate examples of some of the signals that may be formed during an example of an operation of an embodiment of the circuit of FIG. 5A in accordance with the present invention.

FIG. 5B is a graph having plots that illustrate examples of some of the signals that may be formed during an example of an operation of an embodiment of circuit 130. A plot 133 illustrates an example of values of control signal $V_{COMP}$, a plot 134 illustrates an example of values of FC signal 32, and a plot 135 illustrates examples of OC signal 63. This description has references to FIG. 1, FIG. 5A, and FIG. 5B.

Assume that at a time prior to a time T0, circuit 130 is not switching signal $S_W$ as a result of a non-switching mode. Also assume that the output voltage $V_O$ is not regulated and is a low value because circuit 130 is not switching signal $S_W$. Since the output voltage is low, the output of amplifier 35 (FIG. 2A) would be saturated and VCOMP would be a high level. Thus, the level of the control signal $V_{COMP}$ is higher than the level of FC signal 32. In other non-switching mode conditions, such as for example the output voltage $V_O$ having a value greater than the target value, a portion of circuit 30 could be formed to detect the non-switching of signal $S_W$ and the high $V_O$ value, and cause $V_{COMP}$ to have a high value. For example, circuit 34 (FIG. 2A) could detect the conditions.

Assume that at time T0 circuit 130 initiates switching of signal $S_W$, and also initiates a start-up sequence. Since the level of control signal $V_{COMP}$ is higher than the level of FC signal 32, selection circuit 132 selects FC signal 32 as OC signal 63 to oscillator 33. Thus, the switching frequency of switching signal $S_W$ is controlled by the value of FC signal 32. Oscillator 33 changes the frequency of switching signal $S_W$ as the value of FC signal 32, thus OC signal 63, changes. Assume that at a time T1, the output voltage $V_O$ reaches substantially the target value and $V_{COMP}$ responsively changes. Assume for this example that the value of $V_{COMP}$ becomes lower than the level of FC signal 32, therefore selection circuit 132 selects $V_{COMP}$ as OC signal 63. Thus, circuit 130 terminates the start-up sequence in response to circuit 130 regulating output voltage $V_O$ to the target value. Thus, in this example embodiment the switching frequency of switching signal $S_W$ is controlled by the control signal $V_{COMP}$ during normal operation or alternately while the output voltage $V_O$ is regulated or alternately while the output voltage $V_O$ is the target value. Thus, circuit 130 is configured to gradually increase the frequency of signal $S_W$ as the duration of the start-up sequence increases.

Figure 6A:
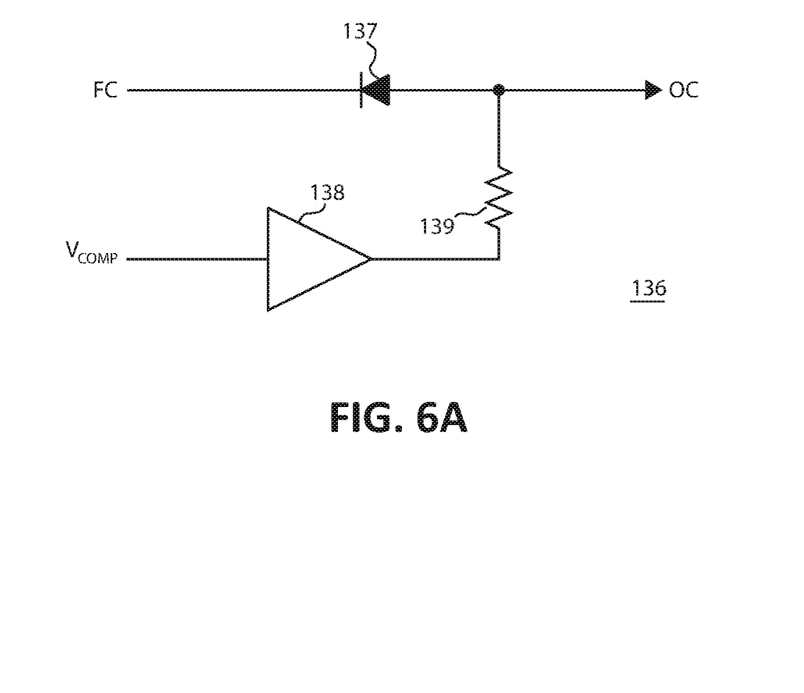
FIG. 6A schematically illustrates an example of a portion of an embodiment of a selection circuit that may have an embodiment that may be an alternate embodiment of one of the circuits of FIG. 5A in accordance with the present invention.

FIG. 6A schematically illustrates an example of a portion of an embodiment of a selection circuit 136 that may have an embodiment that may be an alternate embodiment of circuit 132 (FIG. 5A). Selection circuit 136 may have an embodiment that operates substantially identical to the operation of circuit 132. Circuit 136 includes a diode 137, a buffer 138, and a resistor 139. Circuit 136 receives FC signal 32, $V_{COMP}$ and responsively forms OC signal 63. A cathode of diode 137 receives FC signal 32, and an anode of diode 137 is coupled to an output terminal of circuit 136. An input terminal of buffer 138 receives $V_{COMP}$. Resistor 139 is coupled between an output terminal of buffer 138 and the anode of diode 137. Circuit 136 is configured to couple FC signal 32 to the output as OC signal 63 in response to FC signal 32 having a value (or level) that is less than the value (or level) of $V_{COMP}$. In response to a $V_{COMP}$ value (or level) that is less than a value (or level) of FC signal 32, circuit 136 is configured to couple $V_{COMP}$ to the output as OC signal 63.

Figure 6B:
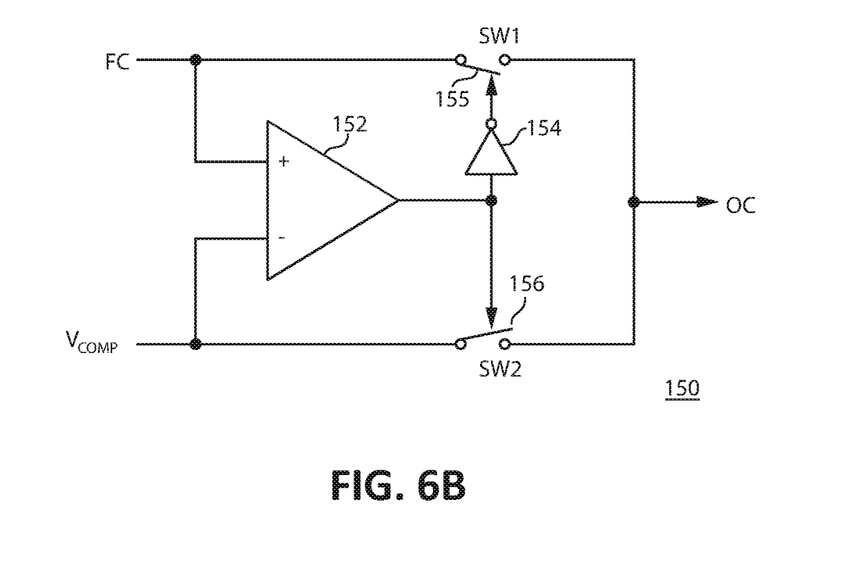
FIG. 6B schematically illustrates an example of a portion of an embodiment of another selection circuit that may have an embodiment that may be an alternate embodiment of one of the circuits of FIG. 5A in accordance with the present invention.

FIG. 6B schematically illustrates an example of a portion of an embodiment of a selection circuit 150 that may have an embodiment that may be an alternate embodiment of either of circuits 132 or 136. Selection circuit 150 may have an embodiment that operates substantially identical to the operation of circuit 132. An embodiment of circuit 150 may include a comparator 152, an inverter 154, a first switch 155 (SW1), and a second switch 156 (SW2). Circuit 150 is configured to receive FC signal 32 at a first input, to receive $V_{COMP}$ at a second input, and to form OC signal 63 at an output of circuit 150. In an embodiment, FC signal 32 is coupled to a first terminal of first switch 155 (SW1), and the second terminal of first switch 155 (SW1) is coupled to the output terminal of circuit 150. FC signal 32 is also coupled to the positive input terminal of comparator 152. $V_{COMP}$ is commonly coupled to the negative input terminal of comparator 152 and to a first terminal of second switch 156 (SW2). A second terminal of second switch 156 (SW2) is coupled to the output terminal of circuit 150. Comparator 152 compares FC signal 32 and $V_{COMP}$ to generate a control signal at the output terminal of comparator 152 for controlling first switch 155 (SW1) through the inverter 154. The control signal of comparator 152 is also used to control the second switch 156 (SW2).

Circuit 150 is configured to couple FC signal 32 to the output as OC signal 63 in response to FC signal 32 being less than $V_{COMP}$. For example, if the level of FC signal 32 is lower than the level of $V_{COMP}$, first switch 155 (SW1) is switched on and second switch 156 (SW2) is switched off, and therefore FC signal 32 is output as OC signal 63 through first switch 155 (SW1). Circuit 150 is also configured to couple $V_{COMP}$ to the output as OC signal 63 in response to $V_{COMP}$ being less than FC signal 32. For example, $V_{COMP}$ is output as OC signal 63 through second switch 156 (SW2) when the level of $V_{COMP}$ is lower than the level of FC signal 32 and the second switch 156 (SW2) is switched on. Thus, circuit 150 is configured to gradually increase the frequency of signal $S_W$ as the duration of the start-up sequence increases.

Figure 7A:
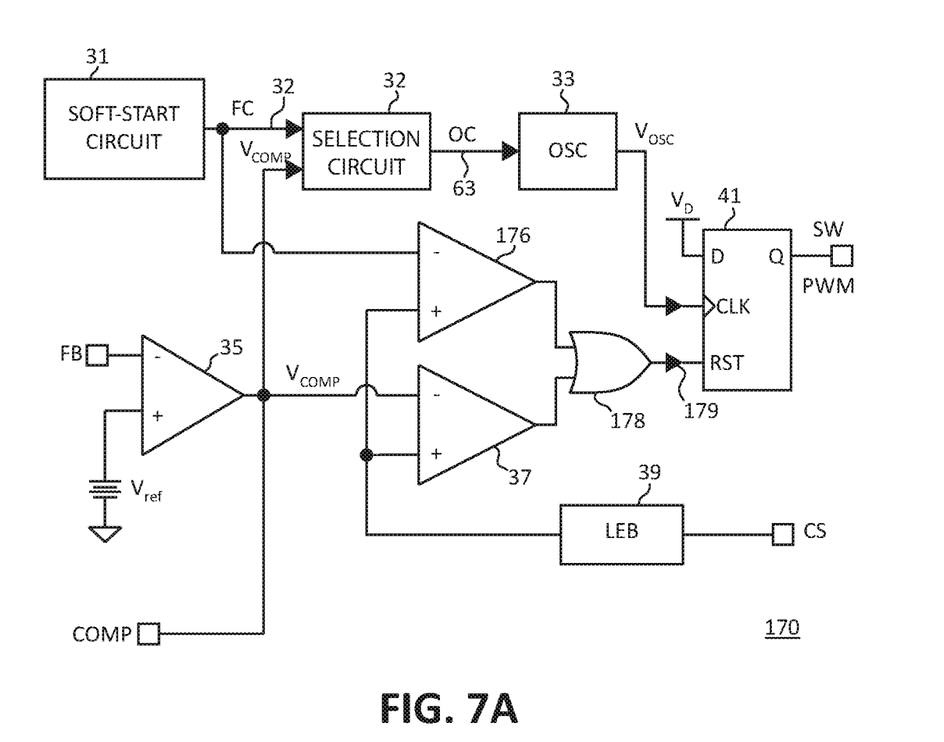
FIG. 7A schematically illustrates an example of a portion of an embodiment of a control circuit that may have an embodiment that may be an alternate embodiment of one of the circuits of FIG. 2A in accordance with the present invention.

FIG. 7A schematically illustrates an example of a portion of an embodiment of a control circuit 170 that may have an embodiment that may be an alternate embodiment of circuit 30 or circuit 130. An embodiment of circuit 170 may be substantially the same as circuit 130 and may operate substantially the same as circuit 130 except that circuit 170 also includes a current limit circuit. An embodiment of circuit 170 may be configured to limit a peak value of primary current 23 during the start-up sequence. Circuit 170 may also be configured to control or limit the peak value of current 23. An embodiment may include that circuit 170 is configured to increase the peak value of current $I_P$ from a first value to a higher second value during the start-up sequence. In an embodiment, circuit 170 may be configured to increase the peak value of current $I_P$ at a rate that is similar to an increase in the frequency of the $V_{OSC}$ signal. Circuit 170 may have an embodiment that may be configured to increase the peak value of current $I_P$ according to the value of FC signal 32 during the start-up sequence. Circuit 170 may also be configured to terminate the start-up sequence in response to a change in load 27 (FIG. 1).

An embodiment of the current limit circuit may be configured to receive FC signal 32 on a first input, to receive the CS signal on a second input and form a control signal 179 on an output of the current limit circuit. Circuit 170 may be formed to terminate the on-time of the signal $S_W$ in response to an asserted state of signal 179. An embodiment of the current limit circuit may be configured to include a comparator 176 and an OR gate 178. In an embodiment, FC signal 32 may be coupled to a negative input terminal of comparator 176, and a positive input terminal of comparator 176 may be coupled to receive the CS signal. The output of comparators 176 and 37 may be coupled to the input terminals of OR gate 178, and the output of OR gate 178, such as for example signal 179, may be coupled to the reset input RST of flip-flop 41. Comparator 176 may be configured to compare FC signal 32 with the CS signal to control the on-time of the switching signal $S_W$ for during the start-up sequence. Comparator 37 may be configured to compare $V_{COMP}$ with the CS signal to control the on-time of switching signal $S_W$ for controlling current $I_P$ (as shown in FIG. 1) during the normal operation period of circuit 170. For example after terminating the start-up sequence.

Figure 7B:
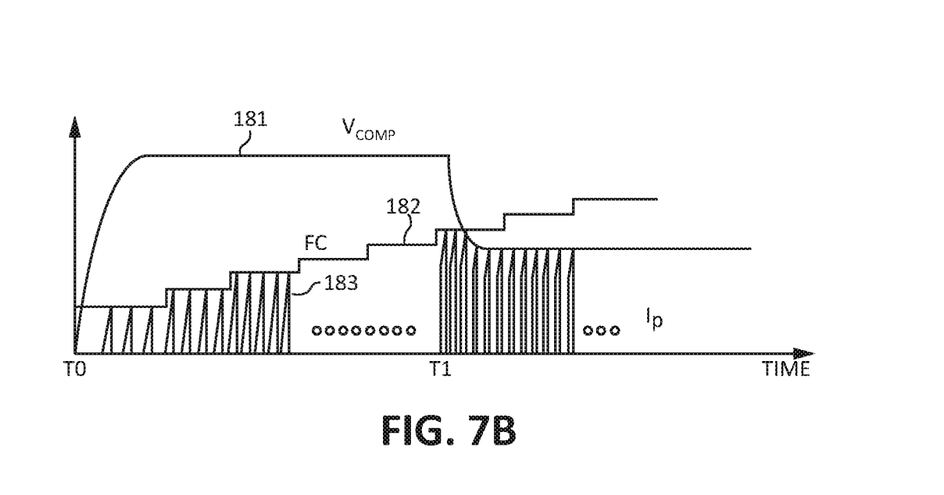
FIG. 7B is a graph having plots that illustrate examples of some of the signals that may be formed during an example of an operation of an embodiment of the circuit of FIG. 7A in accordance with the present invention.

FIG. 7B is a graph having plots that illustrate examples of some of the signals that may be formed during an example of an operation of an embodiment of circuit 170. A plot 181 illustrates an example of values of control signal $V_{COMP}$, a plot 182 illustrates an example of values of FC signal 32, and a plot 183 illustrates examples of current $I_P$ flowing through primary winding $N_P$ of transformer 10 including the peak value thereof. This description has references to FIG. 1, FIG. 7A, and FIG. 7B.

Assume that at a time prior to T0, circuit 170 is not switching signal $S_W$ during the non-switching mode. Also assume that the output voltage $V_O$ is not regulated because circuit 170 is not switching signal $S_W$. Thus, the level of the control signal $V_{COMP}$ is higher than the level of FC signal 32.

Assume that at time T0, circuit 170 initiates switching of signal $S_W$, and also initiates a start-up sequence. Therefore, the output voltage $V_O$ isn't regulated to the target value yet during the start-up sequence. The level of control signal $V_{COMP}$ is higher than the level of FC signal 32, therefore, the output of comparator 176 is asserted in response to the CS signal before the output of comparator 37. The asserted output of comparator 176 results in terminating the on-time of signal $S_W$. Therefore, the switching signal $S_W$ is disabled by comparator 176. Consequently, the peak value of current $I_P$ is limited according to the value of FC signal 32 during the start-up sequence. The on-time of the switching signal $S_W$ is gradually increased, thus the peak value of current $I_P$ is gradually increased, in response to the increase of the level of FC signal 32 during the start-up sequence. Thus, circuit 170 is configured to gradually increase the peak value of current $I_P$ as the duration of the start-up sequence increases.

Assume that at a time T1, the output voltage $V_O$ reaches substantially the target value and $V_{COMP}$ responsively changes. Assume for this example that, in response, the value of $V_{COMP}$ becomes lower than the level of FC signal 32. In this example, circuit 170 terminates the start-up sequence in response to circuit 170 regulating output voltage $V_O$ to the target value. Consequently, the value of the CS signal reaches the value of $V_{COMP}$ before it can reach the value of FC signal 32 thereby asserting the output of comparator 37 instead of comparator 176. The asserted state of the output of comparator 37 terminates the on-time of switching signal S. Thus, the peak value of current $I_P$ is limited by the control signal $V_{COMP}$ during the normal operation period. The on-time of the switching signal $S_W$ is also controlled by the control signal $V_{COMP}$ during the normal operation period or alternately while the output voltage $V_O$ is regulated.

Figure 8:
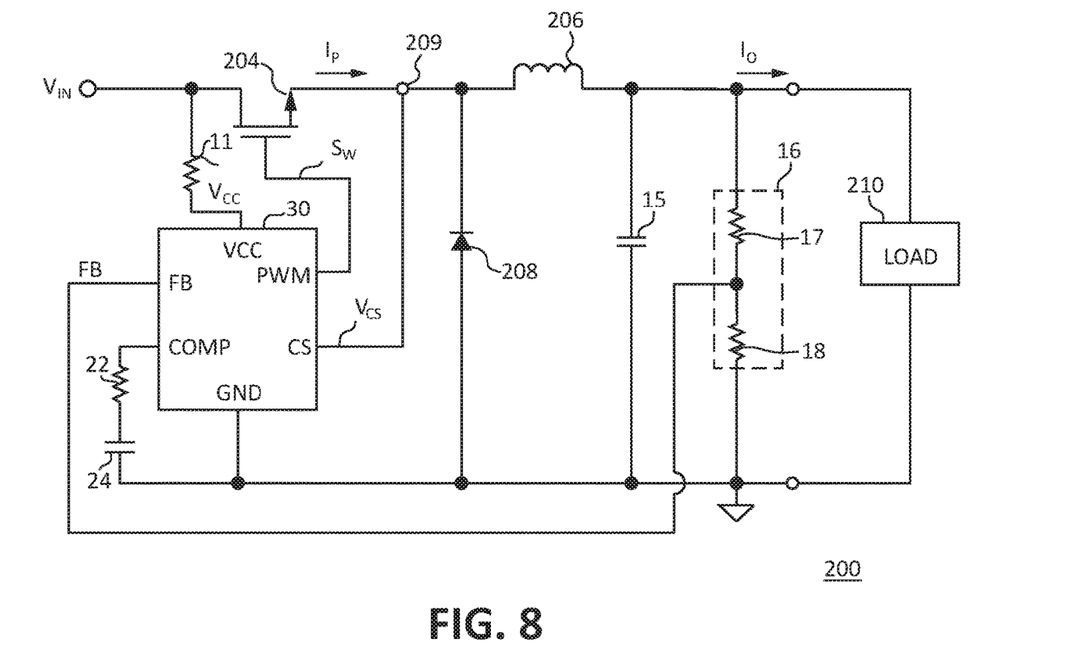
FIG. 8 schematically illustrates an example of a portion of an embodiment of a buck power supply system in accordance with the present invention.

FIG. 8 schematically illustrates an example of a portion of an embodiment of a buck power supply system 200. System 200 includes circuit 30 or alternately any of circuits 130 or 170. The example embodiment of system 200 includes an inductor 206 but does not include transformer 10 and auxiliary winding $N_A$ of system 50. Additionally diode 13 and capacitor 12 are also not included. Thus, resistor 11 is coupled between input voltage $V_{IN}$ and supply terminal VCC of circuit 30 for providing the supply voltage $V_{CC}$ to the supply terminal VCC. A power transistor 204 is coupled between input voltage $V_{IN}$ and the first terminal of inductor 206. The second terminal of inductor 206 is coupled to the output terminal of system 200 for generating output voltage $V_O$ and output current $I_O$ for a load 210.

The current sense input CS of circuit 30 is coupled to a node 209 formed at the connection of power transistor 204 and inductor 206 to receive CS signal for sensing the current $I_P$ flowing through power transistor 204. Circuit 30 generates the switching signal $S_W$ at the output terminal PWM to switch transistor 204 in response to the CS signal. Circuit 30 controls the switching signal $S_W$ in accordance with the FB signal for regulating output (output voltage $V_O$ and/or output current $I_O$) of system 200. A cathode of a rectifier 208 is coupled to node 209, and an anode of rectifier 208 is coupled to a common return.

Figure 9:
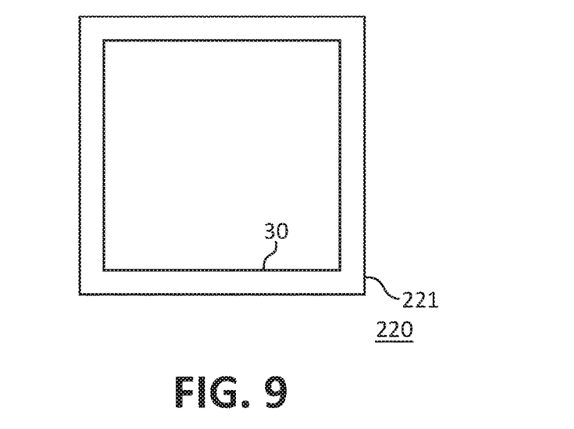
FIG. 9 illustrates an enlarged plan view of a portion of an embodiment of a semiconductor device that may include one of the circuits of FIGS. 2A, 5A, or 7A in accordance with the present invention.

FIG. 9 illustrates an enlarged plan view of a portion of an embodiment of a semiconductor device or integrated circuit 220 that is formed on a semiconductor die 221. In an embodiment, any one of 30, 130, or 170 may be formed on die 221. Die 221 may also include other circuits that are not shown in FIG. 9 for simplicity of the drawing. The circuit or integrated circuit 220 may be formed on die 221 by semiconductor manufacturing techniques that are well known to those skilled in the art.

From all the foregoing, one skilled in the art will appreciate that a control circuit for a power supply may comprise:

the control circuit, such as for example one or more of circuits 30, 130, and/or 170, configured to operate a switching signal, such as for example signal SW, at a frequency to switch a power switch, such as for example transistor 20, and to regulate an output voltage, such as for example output voltage VO, to a target value;

an oscillator, such as for example circuit 30, configured to form an oscillator signal at the frequency, and to cause the switching signal to switch at the frequency; and a first circuit, such as for example circuit 31, configured to control the frequency of the oscillator signal to increase during a start-up sequence initiated by the control circuit wherein the control circuit terminates increasing the frequency in response to regulating the output voltage to the target value.

In an embodiment, the control circuit may be configured to initiate the start-up sequence after the switching signal is not switched as a result of operating in a non-switching mode.

An embodiment may include that the control circuit may be configured to initiate the start-up sequence in response to power being applied to the control circuit.

Another embodiment may include that the first circuit may be configured to incrementally increase the frequency of the oscillator signal in a number of steps during the start-up sequence.

The control circuit may have an embodiment that may include that the first circuit may include a counter that increments and increases the frequency with each increment of the counter.

In an embodiment, outputs of the counter may drive inputs of a multiplexer to select different multiplexer inputs for each increment of the counter.

An embodiment may include that control circuit may include an error amplifier configured to form an error signal in response to a feedback signal that is representative of the output voltage, wherein the first circuit is configured to form a control signal, such as for example FC signal 32, to increase the frequency of the oscillator signal, and wherein the control circuit terminates the start-up sequence in response to the error signal changing to a value that is less than the control signal from the first circuit.

Another embodiment may also include a current limit circuit configured to limit a peak value of a current through the power switch and to increase the peak value at a rate corresponding to the frequency increase.

In an embodiment, the first circuit may be configured to form a control signal to increase the frequency of the oscillator signal, the control circuit further including a current limit circuit configured to limit a peak value of a current through the power switch according to the value of the control signal.

Those skilled in the art will also appreciate that a method of forming a control circuit for a power supply may comprise:

forming the control circuit to form a switching signal to switch a power switch to regulate an output voltage to a target value;

forming a variable frequency oscillator, such as for example oscillator 33, to oscillate at a frequency wherein the control circuit switches the switching signal at a target frequency in response to the output voltage having the target value; and forming a first circuit, such as for example circuit 31 and/or 132, to initiate increasing the frequency from a first frequency that is less than the target frequency to a second frequency, that is greater than the first frequency and is also less than the target frequency, responsively to the control circuit operating in a start-up mode wherein the first circuit is configured to continue increasing the frequency until the output voltage reaches substantially the target value.

The method may also have an embodiment that may include forming the control circuit to include a skip-cycle circuit that inhibits the control circuit from switching the switching signal while the output voltage is within a target range of the target value.

An embodiment of the method may include forming the control circuit to operate in the start-up mode in response to application of power to the control circuit.

Another embodiment may include forming the control circuit to operate in the start-up mode in response to the control circuit initiating switching of the switching signal after stopping switching of the switching signal in response to the output voltage being either greater than or less than the target value.

An embodiment may include forming the control circuit to operate in the start-up mode in response to initiating switching of the switching signal after stopping switching of the switching signal while the output voltage is not approximately the target value.

The method may also have an embodiment that may include forming the first circuit to form a control signal that controls the frequency including configuring the first circuit to increase the control signal from a first value to a second value during the start-up mode to cause the variable frequency oscillator to increase the frequency from the first frequency to the second frequency.

Another embodiment may include forming the first circuit, such as for example circuit 105, to include a timing oscillator, such as for example oscillator 107, that operates at a timing frequency that has a frequency that is between approximately 100 Hz and approximately 10 kHz.

those skilled in the art will also appreciate that a method of forming a power supply control circuit may comprise:

forming a control circuit to form a switching signal to switch a power transistor at a frequency to regulate an output voltage of the power supply to a target value wherein the control circuit is configured to operate in a normal operating mode and a start-up mode and wherein the control circuit is configured to switch the switching signal at a target frequency in response to operating in the normal operating mode; and configuring a first circuit to control the frequency of the switching signal to increase from substantially a first frequency to a second frequency that is less than the target frequency in response to operating in the start-up mode.

The method may also have an embodiment that may include forming the control circuit to include a variable frequency oscillator that forms the frequency of the switching signal responsively to a control signal received from the first circuit wherein the first circuit increases the control signal from a first value to a second value to cause the control circuit to responsively increase the frequency of the switching signal from the first frequency to the second frequency.

An embodiment may also include configuring the control circuit to limit a peak value of current through the power transistor during the start-up mode according to the control of the frequency of the switching signal.

Another embodiment may include configuring the first circuit to form a control signal that increases from a first value to a second value to cause the control circuit to responsively increase the frequency of the switching signal, and configuring the control circuit to limit the peak value of the current according to the control signal.

In view of all of the above, it is evident that a novel device and method is disclosed. Included, among other features, is forming a control circuit to gradually increase the frequency of a switching signal of a power supply controller in response to starting, or re-starting, switching of the switching signal after not switching the switching signal. For example, in response to applying power to the power supply controller. Gradually increasing the switching frequency reduces ringing and spikes in the primary current.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, the example form of control circuit 30 is used as a vehicle to explain the operation method of gradually increasing the frequency of the switching signal. Those skilled in the art will appreciate that other circuits may be used to form variable frequency oscillator 33, and other circuit configurations may be used to form soft-start circuit 31 as long as the circuits are configured to gradually increase the frequency of switching signal S. Additionally, various types of circuits may be used to detect the non-switching condition and for one or more signals that cause circuit 30 to operate in the non-switching mode.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A control circuit for a power supply comprising:
the control circuit configured to operate a switching signal at a frequency to switch a power switch and to regulate an output voltage to a target value;
an oscillator configured to form an oscillator signal at the frequency, and to cause the switching signal to switch at the frequency; and
a first circuit configured to control the frequency of the oscillator signal to step-wise increase during a start-up sequence initiated by the control circuit wherein the control circuit terminates increasing the frequency in response to the output voltage increasing from a first value to the target value wherein the first value is less than the target value.

2. The control circuit of claim 1 wherein the control circuit initiates the start-up sequence after the switching signal is not switched as a result of operating in a non-switching mode.

3. The control circuit of claim 1 wherein the control circuit is configured to initiate the start-up sequence in response to power being applied to the control circuit.

4. The control circuit of claim 1 wherein the first circuit is configured to incrementally increase the frequency of the oscillator signal in a number of steps during the start-up sequence.

5. The control circuit of claim 1 wherein the first circuit includes a counter that increments and increases the frequency with each increment of the counter.

6. The control circuit of claim 5 wherein outputs of the counter drive inputs of a multiplexer to select different multiplexer inputs for each increment of the counter.

7. The control circuit of claim 1 wherein the control circuit includes an error amplifier configured to form an error signal in response to a feedback signal that is representative of the output voltage, wherein the first circuit is configured to form a control signal to increase the frequency of the oscillator signal, and wherein the control circuit terminates increasing the frequency in response to the error signal changing to a value that is less than the control signal from the first circuit.

8. The control circuit of claim 1 further including a current limit circuit configured to limit a peak value of a current through the power switch and to increase the peak value at a rate corresponding to the frequency increase.

9. The control circuit of claim 1 wherein the first circuit is configured to form a control signal to increase the frequency of the oscillator signal, the control circuit further including a current limit circuit configured to limit a peak value of a current through the power switch according to the value of the control signal.

10. A method of forming a control circuit for a power supply comprising:
forming the control circuit to form a switching signal to switch a power switch to regulate an output voltage to a target value;
forming a variable frequency oscillator to oscillate at a frequency wherein the control circuit switches the switching signal at a target frequency in response to the output voltage having the target value; and
forming a first circuit to initiate increasing the frequency from a first frequency that is less than the target frequency to a second frequency, that is greater than the first frequency and is also less than the target frequency, responsively to the control circuit operating in a start-up mode wherein the first circuit is configured to continue increasing the frequency and terminate increasing the frequency in response to the output voltage becoming the target value.

11. The method of claim 10 further including forming the control circuit to include a skip-cycle circuit that inhibits the control circuit from switching the switching signal while the output voltage is within a target range of the target value.

12. The method of claim 10 further including forming the control circuit to operate in the start-up mode in response to application of power to the control circuit.

13. The method of claim 10 further including forming the control circuit to operate in the start-up mode in response to the control circuit initiating switching of the switching signal after stopping switching of the switching signal in response to the output voltage being either greater than or less than the target value.

14. The method of claim 10 further including forming the control circuit to operate in the start-up mode in response to initiating switching of the switching signal after stopping switching of the switching signal while the output voltage is not approximately the target value.

15. The method of claim 10 further including forming the first circuit to form a control signal that controls the frequency including configuring the first circuit to increase the control signal from a first value to a second value during the start-up mode to cause the variable frequency oscillator to increase the frequency from the first frequency to the second frequency.

16. The method of claim 10 further including forming the first circuit to include a timing oscillator that operates at a timing frequency that has a frequency that is between approximately 100 Hz and approximately 10 kHz wherein the time intervals are periods of the timing frequency.

17. A method of forming a power supply control circuit comprising:

forming a control circuit to form a switching signal to switch a power transistor at a frequency to regulate an output voltage of the power supply to a target value wherein the control circuit is configured to operate in a normal operating mode and a start-up mode and wherein the control circuit is configured to switch the switching signal at a target frequency in response to operating in the normal operating mode; and configuring a first circuit to control the frequency of the switching signal to increase from a first frequency to a second frequency that is less than the target frequency in response to operating in the start-up wherein the first circuit terminates increasing the frequency of the switching signal in response to the output voltage becoming the target value.

18. The method of claim 17 further including forming the control circuit to include a variable frequency oscillator that forms the frequency of the switching signal responsively to a control signal received from the first circuit wherein the first circuit increases the control signal from a first value to a second value to cause the control circuit to responsively increase the frequency of the switching signal from the first frequency to the second frequency.

19. The method of claim 17 further including configuring the control circuit to limit a peak value of current through the power transistor during the start-up mode according to the control of the frequency of the switching signal.

20. The method of claim 17 further including configuring the first circuit with a timing oscillator that operates at a timing frequency that is less than the first frequency and wherein the first circuit forms a control signal that increases from a first value to a second value to cause the control circuit to responsively increase the frequency of the switching signal, and configuring the control circuit to limit a peak value of a current through the power switch according to the control signal.

* * * * *